United States Patent
Harada et al.

(10) Patent No.: US 8,421,086 B2
(45) Date of Patent: Apr. 16, 2013

(54) SILICON CARBIDE SEMICONDUCTOR DEVICE AND METHOD OF MANUFACTURING THE SAME

(75) Inventors: Shin Harada, Osaka (JP); Masato Tsumori, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 139 days.

(21) Appl. No.: 12/936,589

(22) PCT Filed: Feb. 3, 2009

(86) PCT No.: PCT/JP2009/051761
§ 371 (c)(1),
(2), (4) Date: Oct. 6, 2010

(87) PCT Pub. No.: WO2010/029776
PCT Pub. Date: Mar. 18, 2010

(65) Prior Publication Data
US 2011/0031505 A1 Feb. 10, 2011

(30) Foreign Application Priority Data
Sep. 12, 2008 (JP) ................................. 2008-235303

(51) Int. Cl.
*H01L 31/0312* (2006.01)

(52) U.S. Cl.
USPC ....... 257/77; 257/E29.104; 438/478; 438/778

(58) Field of Classification Search ................ 257/77, 257/E21.09, E29.104; 438/478, 778
See application file for complete search history.

(56) References Cited

U.S. PATENT DOCUMENTS

| | | | |
|---|---|---|---|
| 6,734,461 B1 * | 5/2004 | Shiomi et al. | 257/77 |
| 6,783,592 B2 * | 8/2004 | Neudeck et al. | 117/97 |
| 2005/0181627 A1 | 8/2005 | Kamata et al. | |
| 2006/0011128 A1 * | 1/2006 | Ellison et al. | 117/84 |
| 2006/0289873 A1 * | 12/2006 | Rowland et al. | 257/77 |
| 2007/0290211 A1 * | 12/2007 | Nakayama et al. | 257/77 |

FOREIGN PATENT DOCUMENTS

| | | |
|---|---|---|
| CN | 1643188 A | 7/2005 |
| EP | 1215730 A1 | 6/2002 |
| KR | 10-2004-0097175 A | 11/2004 |
| WO | WO-0118872 A1 | 3/2001 |
| WO | WO-03078702 A1 | 9/2003 |

OTHER PUBLICATIONS

Kimoto et al., "Effects of C/Si Ratio in Chemical Vapor Deposition of 4H-SiC(1120) and (0338)," Japanese Journal of Applied Physics, vol. 42, Part 1, No. 12, pp. 7294-7295, 2003.

* cited by examiner

*Primary Examiner* — John C Ingham
(74) *Attorney, Agent, or Firm* — Venable LLP; Michael A Sartori; Tamatane J. Aga (57) ABSTRACT

A silicon carbide semiconductor device having an active layer with reduced defect density which is formed on a substrate made of silicon carbide, and a method of manufacturing the same are provided. A semiconductor device includes a substrate made of silicon carbide and having an off angle of not less than 50° and not more than 65° with respect to a plane orientation {0001}; a buffer layer, and an epitaxial layer, a p-type layer and an n$^+$ region each serving as an active layer. The buffer layer is made of silicon carbide and formed on the substrate. The active layer is made of silicon carbide and formed on the buffer layer. The micropipe density is lower in the active layer than in the substrate. The density of dislocations in which the direction of a Burgers vector corresponds to is higher in the active layer than in the substrate.

On the film forming conditions in the step of forming the buffer layer, the composition and the flow rate of the material gas is determined such that the value of the C/Si ratio representing a ratio of carbon atoms to silicon atoms in the material gas used for forming the buffer layer is smaller than the value of the C/Si ratio in the step of forming the active layer.

8 Claims, 5 Drawing Sheets

SILICON CARBIDE SEMICONDUCTOR DEVICE AND METHOD OF MANUFACTURING THE SAME

TECHNICAL FIELD

The present invention relates to a silicon carbide semiconductor device and a method of manufacturing the same, and more particularly to a silicon carbide semiconductor device exhibiting excellent electrical characteristics and a method of manufacturing the same.

BACKGROUND ART

The semiconductor device using silicon carbide (SiC) is conventionally known (for example, International Publication No. WO01/018872 (hereinafter referred to as Patent Document 1)). Patent Document 1 discloses a configuration of a silicon carbide semiconductor device in which a buffer layer made of SiC is formed on a 4H-polytype SiC substrate having a plane orientation of approximately {03-38}. The plane having a plane orientation of {03-38} (a {03-38} plane) is inclined about 35° with respect to the <0001> axial direction to which a micropipe and a screw dislocation extend. Accordingly, in the case where a buffer layer is formed on the above-described SiC substrate, the micropipe and screw dislocation in the SiC substrate extend in an inclined direction and disappear on the side surface of the buffer layer and the like. This prevents the micropipe and screw dislocation from extending to the epitaxial layer (active layer) formed on the buffer layer, with the result that the epitaxial layer having less defects and an excellent flatness can be obtained. Furthermore, in Patent Document 1, it is preferable that the above-described buffer layer has a thickness of not less than 0.1 μm and not more than 15 μm.

Patent Document 1: International Publication No. WO01/018872

DISCLOSURE OF THE INVENTION

Problems to be Solved by the Invention

However, as a result of the review, the inventors found that the conventional silicon carbide semiconductor device as described above makes it difficult to fully reduce defects. Specifically, assume that the SiC substrate having a {03-38} plane as a main surface as described above has a size of 2 inches, for example. In this case, defects such as micropipes extend in the inclined direction (<0001> axial direction) as described above. This requires a buffer layer having a thickness of 36 mm according to calculation in order to cause the defects to completely disappear on the side surface of the buffer layer. This is not practical. Therefore, reducing the defects in the active layer formed on the SiC substrate is still a significant task.

The present invention has been made in order to solve the above-described problems, and an object of the present invention is to provide a silicon carbide semiconductor device in which an active layer with decreased defect density is formed on a substrate made of silicon carbide, and a method of manufacturing the same.

Means for Solving the Problems

A silicon carbide semiconductor device according to the present invention includes a substrate made of silicon carbide and having an off angle of not less than 50° and not more than 65° with respect to a plane orientation {0001}, a buffer layer, and an active layer. The buffer layer is made of silicon carbide and formed on the substrate. The active layer is made of silicon carbide and formed on the buffer layer. A micropipe density is lower in the active layer than in the substrate. A density of dislocations in which a direction of a Burgers vector corresponds to [0001] is higher in the active layer than in the substrate.

In this way, the electrical characteristics of the active layer can be improved by decreasing the density of the micropipes in the active layer. Consequently, the silicon carbide semiconductor device exhibiting excellent electrical characteristics can be implemented.

In a method of manufacturing a silicon carbide semiconductor device according to the present invention, a step of preparing a substrate made of silicon carbide and having an off angle of not less than 50° and not more than 65° with respect to a plane orientation {0001} is carried out. A step of forming a buffer layer made of silicon carbide on the substrate is carried out. A step of forming an active layer on the buffer layer is carried out. In the step of forming the buffer layer, the buffer layer is formed on film forming conditions that a micropipe density is lower in the buffer layer than in the substrate and a density of dislocations in which a direction of a Burgers vector corresponds to [0001] is higher in the buffer layer than in the substrate. Specifically, in the step of forming the buffer layer, the buffer layer is formed on a film forming condition that the micropipes divide into screw dislocations (dislocation in which a Burgers vector b=[0001] and the extending direction of the dislocation corresponds to approximately [0001]). Furthermore, it is preferable to set the film forming condition that a part of the screw dislocation is modified to a partial dislocation (dislocation in which Burgers vector b=[0001] and the extending direction of the dislocation corresponds to approximately [11-20]).

In this way, as the micropipe density in the buffer layer is decreased below the micropipe density in the substrate, the micropipe density in the active layer formed on the buffer layer can consequently be decreased below the micropipe density in the substrate. Furthermore, as the micropipe density in the buffer layer is decreased, the density of the defects occurring (due to the micropipe defects in the buffer layer) during growth of the active layer can be decreased. As a result, the silicon carbide semiconductor device having an active layer with few micropipe defects can readily be provided.

Effects of the Invention

According to the present invention, the density of the defects such as micropipes is decreased in the active layer formed on the silicon carbide substrate with a buffer layer interposed therebetween, to allow a silicon carbide semiconductor device exhibiting excellent electrical characteristics to be implemented.

DESCRIPTION OF THE REFERENCE SIGNS

1 semiconductor device, 2 substrate, 3 epitaxial layer, 4 p-type layer, 5, 6, 24 n$^+$ region, 7, 8, 26 oxide film, 10 gate electrode, 11 source electrode, 12 drain electrode, 21 buffer layer, 22 voltage maintained layer, 23 p region, 25, 33 p$^+$ region, 27 upper source electrode, 31 n$^-$ layer, 32 p layer, 34, 35 electrode.

BEST MODES FOR CARRYING OUT THE INVENTION

The embodiments of the present invention will be hereinafter described with reference to the accompanying drawings, in which the same or corresponding components are designated by the same reference characters, and description thereof will not be repeated.

First Embodiment

Figure 1:
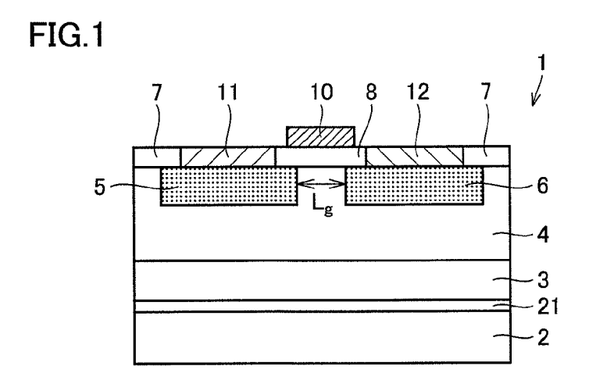
FIG. 1 is a schematic cross-sectional view of a semiconductor device according to the present invention.

Referring to FIG. 1, the first embodiment of the semiconductor device according to the present invention will be described.

A semiconductor device 1 shown in FIG. 1 which is a lateral MOSFET (Metal-Oxide-Semiconductor Field-effect Transistor) as a silicon carbide semiconductor device includes a substrate 2 made of silicon carbide (SiC), a buffer layer 21 made of silicon carbide formed on substrate 2, an epitaxial layer 3 made of silicon carbide formed on buffer layer 21, a p-type layer 4 made of silicon carbide formed on epitaxial layer 3, n$^+$ regions 5 and 6 formed on the surface of p-type layer 4 at a distance from each other, an oxide film 8 as a gate insulation film located on a channel region between n$^+$ regions 5 and 6, a gate electrode 10 formed on oxide film 8, and a source electrode 11 and a drain electrode 12 formed on n$^+$ regions 5 and 6, respectively. Substrate 2 serves as an SiC substrate having, as a main surface, a (03-38) plane at an off angle of approximately 53° with respect to a plane orientation {0001}. Substrate 2 contains n-type conductive impurities.

Buffer layer 21 made of silicon carbide formed on substrate 2 has n-type conductivity and a thickness of, for example, 0.5 µm.

Epitaxial layer 3 made of silicon carbide formed on buffer layer 21 is an undoped layer. P-type layer 4 formed on epitaxial layer 3 contains p-type conductive impurities. Furthermore, the n-type conductive impurities are implanted into n$^+$ regions 5 and 6. Oxide films 7 and 8 are formed so as to cover p-type layer 4 and n$^+$ regions 5 and 6. An opening is provided in the region of each of oxide films 7 and 8 located on n$^+$ regions 5 and 6, respectively. Source electrode 11 and drain electrode 12 electrically connected to n$^+$ regions 5 and 6, respectively, are formed within each opening. Gate electrode 10 is disposed on oxide film 8 acting as a gate insulation film. A channel length Lg corresponding to a distance between n$^+$ regions 5 and 6 can be set at, for example, approximately 100 µm. Furthermore, the channel width can be, for example, approximately twice as large as the above-mentioned channel length Lg (approximately 200 µm).

In the semiconductor device shown in FIG. 1, the micropipe density is lower in epitaxial layer 3, p-type layer 4, and n$^+$ regions 5 and 6 each as an active layer than in substrate 2. Furthermore, the density of dislocations in which a direction of a Burgers vector b corresponds to [0001] is higher in epitaxial layer 3, p-type layer 4 and n$^+$ regions 5 and 6 each as an active layer than in substrate 2. Thus, as the micropipe density in epitaxial layer 3, p-type layer 4 and the like is decreased, deterioration of the electrical characteristics of semiconductor device 1 occurring due to existence of the micropipes in p-type layer 4 and the like can be prevented.

Furthermore, in the above-described semiconductor device 1, the micropipe density in epitaxial layer 3, p-type layer 4 and n$^+$ regions 5 and 6 each serving an active layer is not more than 1 cm$^{-2}$. In this case, in semiconductor device 1, the probability of occurrence of malfunction caused by existence of the micropipes can be decreased. Consequently, the manufacturing yield of semiconductor device 1 can be improved.

Furthermore, according to the above-described semiconductor device 1, the density of basal plane dislocations in which the direction of the Burgers vector corresponds to [11-20] and the direction of the dislocation line substantially corresponds to [11-20] is lower in epitaxial layer 3, p-type layer 4 and n$^+$ regions 5 and 6 each serving as an active layer than in substrate 2, and the density of edge dislocations in which the direction of the Burgers vector corresponds to [11-20] and the direction of the dislocation line substantially corresponds to [0001] is higher in epitaxial layer 3, p-type layer 4 and n$^+$ regions 5 and 6 each serving as an active layer than in substrate 2.

In this case, since the density of basal plane dislocations relatively affecting the characteristics (leakage current and long-term reliability of the electrical characteristics) of semiconductor device 1 is decreased in epitaxial layer 3, p-type layer 4 and n$^+$ regions 5 and 6, the leakage current in the reverse direction in semiconductor device 1 can be reduced (breakdown voltage can be improved), and also, the long-term reliability of semiconductor device 1 can be improved. Specifically, formation of oxide films 7 and 8 on p-type layer 4 in FIG. 1 produces an effect that the repetitive operation life of semiconductor device 1 is extended. The edge dislocations as described above have little effect on the characteristics of semiconductor device 1 as compared with the basal plane dislocations, and accordingly, even if they exist to some extent in the active layer, deterioration in the characteristics of semiconductor device 1 becomes sufficiently small.

Figure 2:
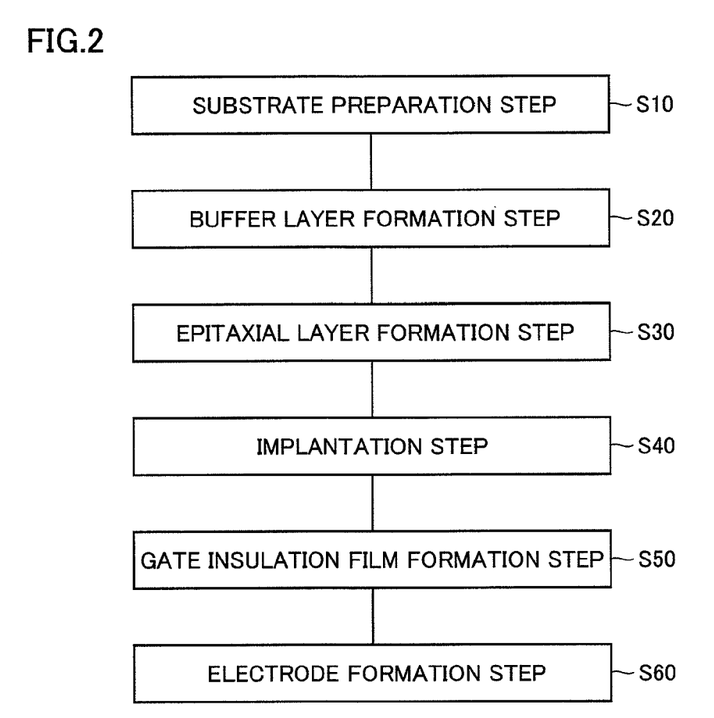
FIG. 2 is a flowchart illustrating a method of manufacturing the semiconductor device shown in FIG. 1.

Referring to FIG. 2, the manufacturing method in the first embodiment of the semiconductor device according to the present invention will then be described.

First, as shown in FIG. 2, the substrate preparation step (S10) is carried out. In this step, specifically, the silicon carbide substrate having n-type conductivity and having a plane of a plane orientation (03-38) as a main surface is prepared as substrate 2 (see FIG. 1). This substrate can be obtained, for example, by the method for which a substrate is cut from the ingot having a (0001) plane as a main surface so as to expose the (03-38) plane as a main surface.

Then, the buffer layer formation step (S20) is carried out. Specifically, an epitaxial layer made of silicon carbide of n-type conductivity and having a thickness of, for example, 0.5 µm is formed as a buffer layer. In this case, for example, SiH$_4$ gas and C$_3$H$_8$ gas are used as material gas used for forming a buffer layer. The flow rate of each gas is set such that the C/Si ratio in each gas (ratio of carbon atoms to silicon atoms contained in the gases) is relatively lowered (as compared with the C/Si ratio in the epitaxial layer formation step (S30) described below). Specifically, the flow rate of the gas is set such that, for example, the C/Si ratio is not less than 1 and not more than 1.5, more preferably, not less than 1 and not more than 1.2. In this way, when buffer layer 21 is formed, the reaction is promoted in which the micropipes in buffer layer 21 produced due to the micropipes in substrate 2 divide into screw dislocations. Also in this way, the density of basal plane dislocations is lower in epitaxial layer 3 formed in the following epitaxial layer formation step (S30) and serving as an active layer than in substrate 2, and the density of edge dislocations is higher in epitaxial layer 3 than in substrate 2.

The epitaxial layer formation step (S30) is then carried out. Specifically, epitaxial layer 3 (see FIG. 1) made of undoped silicon carbide is formed on buffer layer 21. In this epitaxial layer formation step (S30), SiH$_4$ gas and C$_3$H$_8$ gas can be used as material gas, for example, as in the buffer layer formation step (S20). The flow rate of each gas is then set such that the C/Si ratio in each gas is relatively greater than the C/Si ratio in the buffer layer formation step (S20). In this case, since the micropipe defect density in buffer layer 21 is decreased, the defect density such as micropipe defect density can be reliably decreased in epitaxial layer 3 forming an active layer, as compared with the defect density in the substrate. Furthermore, the density of basal plane dislocations is lower in epitaxial layer 3 which is to serve as an active layer than in substrate 2, and the density of edge dislocations is higher in epitaxial layer 3 than in substrate 2.

Then, the implantation step (S40) is carried out. Specifically, the conductive impurities (for example, aluminum (Al)) of p-type conductivity are first implanted into epitaxial layer 3 to thereby form p-type layer 4, as shown in FIG. 1. The impurities of n-type conductivity are then implanted to form n$^+$ regions 5 and 6 as shown in FIG. 1. For example, phosphorus (P) can be used as these conductive impurities of n-type conductivity. In the case where n$^+$ regions 5 and 6 are formed, any conventional and well-known method can be used. For example, after forming the oxide film so as to cover the upper surface of p-type layer 4, an opening having the same planar shape pattern as that in the region in which n$^+$ regions 5 and 6 are to be formed by photolithography and etching is provided in the oxide film. Furthermore, the conductive impurities are implanted using, as a mask, the oxide film having this pattern formed therein. Thus, n$^+$ regions 5 and 6 as described above can be formed.

Subsequently, the activation annealing process for activating the implanted impurities is carried out. This activation annealing process may be carried out on the conditions that, for example, the heating temperature is set at 1700° C. and the heating time is set for 30 minutes.

Then, as shown in FIG. 2, the gate insulation film formation step (S50) is carried out. Specifically, after the upper surface of each of p-type layer 4 and n$^+$ regions 5 and 6 is subjected to the sacrificial oxidation process, an oxide film that is to constitute each of oxide films 7 and 8 serving as a gate insulation film is formed so as to cover the surfaces of p-type layer 4 and n$^+$ regions 5 and 6. The oxide film may have a thickness of, for example, 40 nm.

Then, as shown in FIG. 2, the electrode formation step (S60) is carried out. Specifically, the photolithography method is used to form a resist film having a pattern on the oxide film. This resist film is used as a mask to partially remove the oxide film, with the result that an opening is formed in the region located on n$^+$ regions 5 and 6. Within this opening, a conductor film is provided which is to serve as each of source electrode 11 and drain electrode 12 shown in FIG. 1. This conductor film is formed in the state where the above-described resist film remains. Then, as the above-described resist film is removed and the conductor film located on the oxide film is removed (lifted-off) together with the resist film, source electrode 11 and drain electrode 12 as shown in FIG. 1 can be formed.

Then, gate electrode 10 (see FIG. 1) is further formed on oxide film 8 which acts as a gate insulation film. Gate electrode 10 may be formed using the method as described below. For example, a resist film having an opening pattern located in the region on oxide film 8 is formed in advance, and a conductor film having a gate electrode configured so as to cover the entire surface of the resist film is formed. The resist film is then removed to thereby remove (lift-off) the conductor film other than the portion corresponding to the conductor film which is to serve as a gate electrode. Consequently, gate electrode 10 is formed as shown in FIG. 1. Thus, the semiconductor device as shown in FIG. 1 can be obtained.

Second Embodiment

Figure 3:
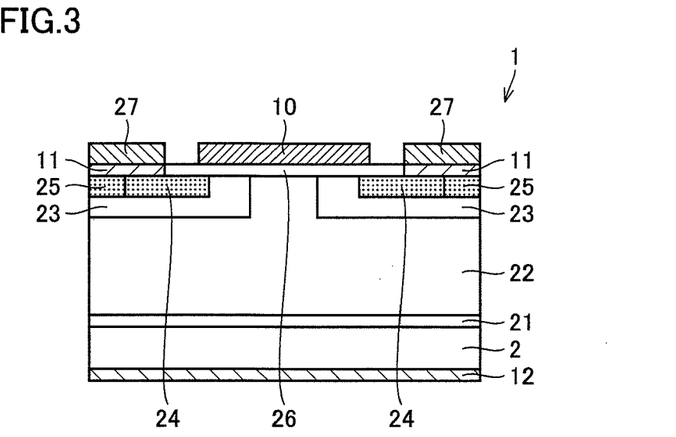
FIG. 3 is a schematic cross-sectional view of the second embodiment of a semiconductor device according to the present invention.

Referring to FIG. 3, the second embodiment of the semiconductor device according to the present invention will then be described.

Referring to FIG. 3, a semiconductor device 1 according to the present invention which is a vertical DiMOSFET (Double Implanted MOSFET) includes a substrate 2, a buffer layer 21, a voltage maintained layer 22, a p region 23, an n$^+$ region 24, a p$^+$ region 25, an oxide film 26, a source electrode 11 and an upper source electrode 27, a gate electrode 10, and a drain electrode 12 formed on the underside of substrate 2. Specifically, buffer layer 21 made of silicon carbide is formed on the surface of substrate 2 made of silicon carbide of n-type conductivity. Buffer layer 21 is of n-type conductivity and has a thickness of, for example, 0.5 μm. Furthermore, the concentration of the n-type conductive impurities in the buffer layer can be set at, for example, 5×10$^{17}$ cm$^{-3}$. Voltage maintained layer 22 is formed on buffer layer 21. Voltage maintained layer 22 is made of silicon carbide of n-type conductivity and has a thickness of, for example, 10 μm. The concentration of the n-type conductive impurities in voltage maintained layer 22 can be set at 5×10$^{15}$ cm$^{-3}$.

Voltage maintained layer 22 has a surface on which p regions 23 of p-type conductivity are formed at a distance from each other. Inside p region 23, n$^+$ region 24 is formed on the surface layer of p region 23. Furthermore, p$^+$ region 25 is formed adjacent to n$^+$ region 24. Oxide film 26 is formed so as to extend to cover the area from n$^+$ region 24 in one p region 23 through the one p region 23, voltage maintained layer 22 exposed between two p regions 23, and the other p region 23 to n$^+$ region 24 in the other p region 23. Gate electrode 10 is formed on oxide film 26. Furthermore, source electrode 11 is formed on n$^+$ region 24 and p$^+$ region 25. Upper source electrode 27 is formed on source electrode 11. Drain electrode 12 is formed on the underside of substrate 2 corresponding to the surface opposite to the surface on which buffer layer 21 is formed.

The micropipe density in n$^+$ region 24, p$^+$ region 25, p region 23, and voltage maintained layer 22 each serving as an active layer is lower than that in substrate 2. The density of dislocations in which the direction of the Burgers vector corresponds to [0001] in n$^+$ region 24, p$^+$ region 25, p region 23, and voltage maintained layer 22 each serving as an active layer is higher than that in substrate 2. Thus, as the micropipe density in the above-described active layer is decreased as compared with the micropipe density in substrate 2, deterioration of the electrical characteristics of the active layer resulting from the micropipes can be prevented. Consequently, semiconductor device 1 (DiMOSFET) exhibiting excellent electrical characteristics can be implemented.

Furthermore, in the above-described semiconductor device 1, the micropipe density in $n^+$ region 24, $p^+$ region 25, p region 23, and voltage maintained layer 22 each as an active layer is not more than 1 cm$^{-2}$. In this case, in semiconductor device 1, the probability of occurrence of malfunction caused by existence of the micropipes can be decreased. Consequently, the manufacturing yield of semiconductor device 1 can be improved.

In the above-described semiconductor device 1, the density of basal plane dislocations is lower in $n^+$ region 24, $p^+$ region 25, p region 23, and voltage maintained layer 22 each as an active layer than in substrate 2, and the density of edge dislocations is higher in $n^+$ region 24, $p^+$ region 25, p region 23, and voltage maintained layer 22 than in substrate 2.

In this case, the density of basal plane dislocations relatively affecting the characteristics (leakage current and long-term reliability of the electrical characteristics) of semiconductor device 1 is decreased in $n^+$ region 24, $p^+$ region 25, p region 23, and voltage maintained layer 22. Accordingly, the leakage current in the reverse direction in semiconductor device 1 can be reduced and the long-term reliability of semiconductor device 1 can also be improved. Specifically, formation of oxide film 26 on voltage maintained layer 22 in FIG. 3 produces an effect that the repetitive operation life of semiconductor device 1 is extended.

The method of manufacturing semiconductor device 1 shown in FIG. 3 will then be described. The substrate preparation step (S10) is first carried out as in the method of manufacturing the semiconductor device shown in FIG. 2. In this case, substrate 2 (see FIG. 3) made of silicon carbide and having a (03-38) plane as a main surface is prepared as in the method of manufacturing the semiconductor device according to the first embodiment of the present invention.

For example, substrate 2 having n-type conductivity and having a substrate resistance of 0.02 Ωm may be used. Furthermore, the concentration of the conductive impurities of substrate 2 may be set at, for example, $1\times10^{19}$ cm$^{-3}$.

Then, the buffer layer formation step (S20) is carried out. Buffer layer 21 may be formed using the same method as that for forming buffer layer 21 in semiconductor device 1 shown in FIG. 1. Furthermore, an epitaxial layer made of silicon carbide of n-type conductivity and having a thickness of, for example, 0.5 μm is formed as a buffer layer. The concentration of the conductive impurities in buffer layer 21 may be set at, for example, $5\times10^{17}$ cm$^{-3}$. The flow rate of the material gas is set such that the C/Si ratio in the material gas used for forming the buffer layer (ratio of carbon atoms to silicon atoms contained in the gas) is relatively lowered (as compared with the C/Si ratio in the epitaxial layer formation step (S30) described below). In this way, when buffer layer 21 is formed, the reaction is promoted in which the micropipes in buffer layer 21 produced due to the micropipes in substrate 2 divide into screw dislocations. Also in this way, the density of basal plane dislocations is lower in voltage maintained layer 22 formed in the epitaxial layer formation step (S30) described below and serving as an active layer than in substrate 2, and the density of edge dislocations is higher in voltage maintained layer 22 than in substrate 2.

The epitaxial layer formation step (S30) is then carried out. Specifically, voltage maintained layer 22 is formed on buffer layer 21. Voltage maintained layer 22 is formed by the epitaxial growth method as a layer made of silicon carbide having n-type conductivity. In this epitaxial layer formation step (S30), for example, SiH$_4$ gas and C$_3$H$_8$ gas can be used as material gas as in the manufacturing method shown in FIG. 2. The flow rate of each gas is then set such that the C/Si ratio in each gas is relatively greater than the C/Si ratio in the buffer layer formation step (S20). In this case, as in the manufacturing method in the first embodiment, since the micropipe defect density in buffer layer 21 is decreased, the defect density such as micropipe defect density in voltage maintained layer 22 forming an active layer can be reliably decreased below the defect density in the substrate. Furthermore, the density of basal plane dislocations is lower in voltage maintained layer 22 which is to serve as an active layer than in substrate 2, and the density of edge dislocations is higher in voltage maintained layer 22 than in substrate 2.

Voltage maintained layer 22 may have a thickness of, for example, 10 μm. Furthermore, the concentration of the n-type conductive impurities in voltage maintained layer 22 may be set at, for example, $5\times10^{15}$ cm$^{-3}$.

Then, the implantation step (S40) is carried out as in the step shown in FIG. 2. Specifically, the oxide film formed using photolithography and etching is used as a mask, to implant the p-type conductive impurities into voltage maintained layer 22, which leads to formation of p region 23 (see FIG. 3). Furthermore, after removing the used oxide film, an oxide film having a new pattern is again formed using photolithography and etching. As the oxide film is then used as a mask to implant the n-type conductive impurities into a predetermined region, $n^+$ region 24 (see FIG. 3) is formed. The p-type conductive impurities are implanted using the same method to thereby form $p^+$ region 25.

After this implantation step (S40), the activation annealing process is carried out. This activation annealing process may be carried out on the conditions that, for example, argon gas is used as ambient gas, the heating temperature is set at 1700° C. and the heating time is set for 30 minutes.

Then, the gate insulation film formation step (S50) is carried out as in the step shown in FIG. 2. Specifically, the oxide film serving as oxide film 26 is formed so as to cover voltage maintained layer 22, p region 23, $n^+$ region 24, and $p^+$ region 25. This oxide film may be formed on the condition that, for example, dry oxidation (thermal oxidation) is applied. This dry oxidation may be carried out on the conditions that the heating temperature is set at 1200° C. and the heating time is set for 30 minutes.

Then, the electrode formation step (S60) is carried out as in the step shown in FIG. 2. Specifically, a resist film having a pattern is formed on the above-mentioned oxide film using the photolithography method. The resist film is used as a mask to remove a portion of the oxide film located on $n^+$ region 24 and $p^+$ region 25 by etching. Subsequently, within the opening provided on the resist film and in the oxide film, a conductor film made of metal and the like is formed so as to come into contact with $n^+$ region 24 and $p^+$ region 25. The resist film is then removed to remove (lift-off) the conductor film located on the resist film. In this case, for example, nickel (Ni) may be used as a conductor. Consequently, as shown in FIG. 3, source electrode 11 and drain electrode 12 can be obtained. It is to be noted that it is preferable to perform heat treatment for alloying. Specifically, the heat treatment (alloying process) is carried out on the conditions that, for example, inert argon (Ar) gas is used as ambient gas, the heating temperature is set at 950° C. and the heating time is set for 2 minutes.

Upper source electrode 27 (see FIG. 3) is then formed on source electrode 11. Drain electrode 12 (see FIG. 3) is also formed on the underside of substrate 2. Thus, the semiconductor device shown in FIG. 3 can be provided.

Third Embodiment

Figure 4:
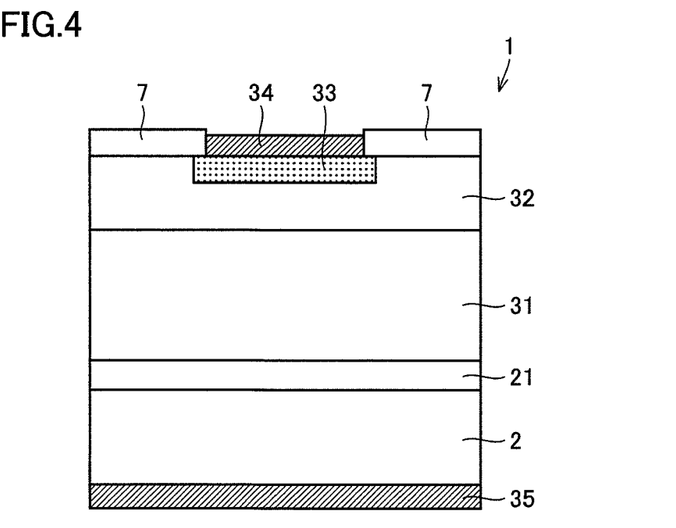
FIG. 4 is a schematic cross-sectional view of the third embodiment of a semiconductor device according to the present invention.

Referring to FIG. 4, the third embodiment of the semiconductor device according to the present invention will then be described.

Referring to FIG. 4, a semiconductor device 1 according to the present invention which is a PN diode includes a substrate 2, a buffer layer 21, a voltage maintained layer 22, an n⁻ layer 31, a p layer 32, a p⁺ region 33, an oxide film 7, and electrodes 34, 35. Specifically, buffer layer 21 made of silicon carbide is formed on the surface of substrate 2 made of silicon carbide of n-type conductivity. Buffer layer 21 is of n-type conductivity and has a thickness of, for example, 0.5 μm. Furthermore, the concentration of the n-type conductive impurities in the buffer layer can be set at, for example, $5 \times 10^{16}$ cm$^{-3}$. N⁻ layer 31 is formed on buffer layer 21. N⁻ layer 31 is made of silicon carbide of n-type conductivity and has a thickness of for example, 50 μm. Furthermore, the concentration of the n-type conductive impurities in n⁻ layer 31 can be set at $1 \times 10^{15}$ cm$^{-3}$.

P layer 32 is formed on n⁻ layer 31. This p layer 32 is made of silicon carbide of p-type conductivity and has a thickness of, for example, 1 μm. The concentration of the p-type conductive impurities in p layer 32 can be set at $1 \times 10^{17}$ cm$^{-3}$.

P⁺ region 33 having p-type conductivity is formed on the surface of p layer 32. P⁺ region 33 may have a thickness of, for example, 0.3 μm, and the concentration of the p-type conductive impurities in p⁺ region 33 may be set at $1 \times 10^{19}$ cm$^{-3}$. Oxide film 7 made of SiO₂ is formed so as to extend from an end of p⁺ region 33 to the upper surface of p layer 32. In other words, an opening for exposing the upper surface of p⁺ region 33 is provided in oxide film 7 formed on the upper surface of p layer 32. Within this opening, electrode 34 is formed so as to contact p⁺ region 33. For example, a nickel (Ni) film or a stacked film of titanium (Ti) and aluminum (Al) may be used as electrode 34. Electrode 35 is formed on the underside of substrate 2 corresponding to the surface opposite to the surface on which buffer layer 21 is formed.

The micropipe density is lower in n⁻ layer 31, p layer 32 and p⁺ region 33 each serving as an active layer than in substrate 2. The density of dislocations in which the direction of the Burgers vector corresponds to [0001] is higher in n⁻ layer 31, p layer 32 and p⁺ region 33 each serving as an active layer than in substrate 2. In this way, as the micropipe density in the above-described active layer is decreased as compared with the micropipe density in substrate 2, deterioration of the electrical characteristics of the active layer resulting from the micropipes can be prevented. As a result, semiconductor device 1 (PN diode) exhibiting excellent electrical characteristics can be implemented.

Furthermore, in the above-described semiconductor device 1, the micropipe density in the active layer (for example, n⁻ layer 31, p layer 32, p⁺ region 33) is not more than 1 cm$^{-2}$. In this case, in semiconductor device 1, the probability of occurrence of malfunction caused by existence of the micropipes can be decreased. Consequently, the manufacturing yield of semiconductor device 1 can be improved.

In the above-described semiconductor device 1, the density of basal plane dislocations is lower in the active layer (for example, n⁻ layer 31, p layer 32, p⁺ region 33) than in substrate 2, and the density of edge dislocations is higher in this active layer than in substrate 2.

In this case, since the density of basal plane dislocations relatively affecting the characteristics (leakage current and long-term reliability of the electrical characteristics) of semiconductor device 1 is decreased in the active layer, the leakage current in the reverse direction in semiconductor device 1 can be reduced and the long-term reliability of semiconductor device 1 can also be improved. Specifically, for example, formation of oxide film 7 on p layer 32 in FIG. 4 produces effects that the repetitive operation life of semiconductor device 1 is extended, and, in the pn diode shown in FIG. 4, the long-term reliability of the forward voltage characteristics is improved (in other words, while the ON resistance tends to increase in accordance with use of the pn diode, the increase in the ON resistance is reduced).

The method of manufacturing semiconductor device 1 shown in FIG. 4 will then be described. The substrate preparation step (S10) is first carried out as in the method of manufacturing the semiconductor device shown in FIG. 2. In this case, substrate 2 (see FIG. 4) made of silicon carbide and having a (03-38) plane as a main surface is prepared as in the method of manufacturing the semiconductor device according to the first embodiment of the present invention.

For example, substrate 2 having n-type conductivity and having a substrate resistance of 0.02 Ωcm may be used. Furthermore, the concentration of the conductive impurities of substrate 2 may be set at, for example, $1 \times 10^{19}$ cm$^{-3}$.

Then, the buffer layer formation step (S20) is carried out. Buffer layer 21 may be formed using the same method as that for forming buffer layer 21 in semiconductor device 1 shown in FIG. 1. Furthermore, an epitaxial layer made of silicon carbide of n-type conductivity and having a thickness of, for example, 0.5 μm is formed as a buffer layer. The concentration of the conductive impurities in buffer layer 21 may be set at, for example, $5 \times 10^{16}$ cm$^{-3}$. The flow rate of the material gas is set such that the C/Si ratio in the material gas used for forming the buffer layer (ratio of carbon atoms to silicon atoms contained in the gas) is relatively lower (than the C/Si ratio in the epitaxial layer formation step (S30) described below). Specifically, as in the method of manufacturing the semiconductor device according to the first embodiment, the flow rate of the gas is set such that, for example, the C/Si ratio is not less than 1 and not more than 1.5, more preferably, not less than 1 and not more than 1.2. In this way, when buffer layer 21 is formed, the reaction is promoted in which the micropipes in buffer layer 21 produced due to the micropipes in substrate 2 divide into screw dislocations. Also in this way, the density of basal plane dislocations becomes lower in n⁻ layer 31 and the like formed in the following epitaxial layer formation step (S30) and serving as an active layer than in substrate 2, and the density of edge dislocations becomes higher in n⁻ layer 31 than in substrate 2.

The epitaxial layer formation step (S30) is then carried out. Specifically, n⁻ layer 31 is formed on buffer layer 21. N⁻ layer 31 is formed by the epitaxial growth method as a layer made of silicon carbide having n-type conductivity. P layer 32 is also formed on n⁻ layer 31. P layer 32 is formed by the epitaxial growth method as a layer made of silicon carbide having p-type conductivity. In this epitaxial layer formation step (S30), for example, SiH₄ gas and C₃H₈ gas can be used as material gas, as in the manufacturing method shown in FIG. 2. The flow rate of each gas is then set such that the C/Si ratio in each gas is relatively greater than the C/Si ratio in the buffer layer formation step (S20). In this case, as in the manufacturing method in the first embodiment, since the micropipe defect density in buffer layer 21 is decreased, the defect density such as micropipe defect density in n⁻ layer 31 and p layer 32 constituting an active layer can be reliably decreased below the defect density in the substrate.

N⁻ layer 31 may have a thickness of, for example, 50 μm. The concentration of the n-type conductive impurities in n⁻ layer 31 may be set at, for example, $1\times10^{15}$ cm$^{-3}$. P layer 32 may have a thickness of, for example, 1 μm. The concentration of the p-type conductive impurities in p layer 32 may be set at, for example, $1\times10^{17}$ cm$^{-3}$.

Then, the implantation step (S40) is carried out as in the step shown in FIG. 2. Specifically, the oxide film formed using photolithography and etching is used as a mask, to implant the p-type conductive impurities into p layer 32, which leads to formation of p$^+$ region 33 (see FIG. 4).

After this implantation step (S40), the activation annealing process is carried out. This activation annealing process may be carried out on the conditions that, for example, argon gas is used as ambient gas, the heating temperature is set at 1700° C. and the heating time is set for 30 minutes.

Then, in contrast to the step shown in FIG. 2, the electrode formation step (S60) is carried out without performing the gate insulation film formation step (S50). Specifically, after removing the oxide film formed in the above-described implantation step (S40), the oxide film covering the upper surfaces of p$^+$ region 33 and p layer 32 is again formed. A resist film having a pattern is formed on the oxide film using the photolithography method. The resist film is used as a mask to remove a portion of the oxide film located on p$^+$ region 33 by etching. A conductor film made of metal (for example, Ni or the stacked structure of Ti and Al (Ti/Al stacked structure) is formed within the opening provided on the resist film and in the oxide film. The conductor film is formed so as to come into contact with p$^+$ region 33 inside the opening. The resist film is then removed to thereby remove (lift-off) the conductor film located on the resist film. Consequently, electrode 34 can be obtained as shown in FIG. 4. It is to be noted that it is preferable to perform heat treatment for alloying at this point. Specifically, the heat treatment (alloying process) is carried out on the conditions that, for example, inert argon (Ar) gas is used as ambient gas, the heating temperature is set at 950° C. and the heating time is set for 2 minutes.

Electrode 35 (see FIG. 4) is then formed on the underside of substrate 2. Thus, the semiconductor device shown in FIG. 4 can be provided.

The characteristic configurations of the present invention will then be described, though some components may be partially the same as those in the above-described embodiments.

A semiconductor device 1 as a silicon carbide semiconductor device according to the present invention includes a substrate 2 made of silicon carbide and having an off angle of not less than 50° and not more than 65° with respect to a plane orientation {0001}, a buffer layer 21, and an active layer (an epitaxial layer 3, a p-type layer 4 and n$^+$ regions 5, 6 in FIG. 1; or an n$^+$ region 24, a p$^+$ region 25, a p region 23 and a voltage maintained layer 22 in FIG. 3; or an n$^-$ layer 31, a p layer 32 and a p$^+$ region 33 in FIG. 4). Buffer layer 21 is made of silicon carbide and formed on substrate 2. The active layer is made of silicon carbide and formed on buffer layer 21. The micropipe density is lower in the active layer (for example, p-type layer 4, voltage maintained layer 22 or n$^-$ layer 31) than in substrate 2. Furthermore, the density of dislocations in which the direction of the Burgers vector corresponds to [0001] is higher in p-type layer 4, voltage maintained layer 22 or n$^-$ layer 31 than in substrate 2.

In this way, as the density of the micropipes in the active layer (for example, p-type layer 4, voltage maintained layer 22 or n$^-$ layer 31) is decreased, the electrical characteristics of p-type layer 4, voltage maintained layer 22 or n$^-$ layer 31 can be improved. Consequently, semiconductor device 1 exhibiting excellent electrical characteristics can be implemented.

It is to be noted that the density of the micropipes may be measured using a method such as observation by an optical microscope, etch pit observation by KOH etching, or the like. Furthermore, the density of dislocations in which the direction of the Burgers vector corresponds to [0001] may be measured using a method such as etch pit observation by KOH etching, X-ray topography, or the like.

In the above-described semiconductor device 1, the micropipe density in the active layer (for example, p-type layer 4, voltage maintained layer 22 or n$^-$ layer 31) may be not more than 1 cm$^{-2}$. In this case, in semiconductor device 1, the probability of occurrence of malfunction caused by existence of the micropipes can be decreased. Consequently, the manufacturing yield of semiconductor device 1 can be improved.

In the above-described semiconductor device 1, the density of basal plane dislocations in which the direction of the Burgers vector corresponds to [11-20] and the direction of the dislocation line substantially corresponds to [11-20] may be lower in the active layer (for example, p-type layer 4, voltage maintained layer 22 or n$^-$ layer 31) than in substrate 2, and the density of edge dislocations in which the direction of the Burgers vector corresponds to [11-20] and the direction of the dislocation line substantially corresponds to [0001] may be higher in the active layer than in substrate 2.

In this case, since the density of basal plane dislocations relatively affecting the characteristics (leakage current and long-term reliability of the electrical characteristics) of semiconductor device 1 is decreased in the active layer, the leakage current in the reverse direction in semiconductor device 1 can be reduced (breakdown voltage can be improved) and the long-term reliability of semiconductor device 1 can also be improved. Specifically, for example, formation of the oxide film on the active layer as shown in FIGS. 1, 3 and 4 (formation of oxide films 7 and 8 on p-type layer 4 in FIG. 1, or formation of oxide film 26 on voltage maintained layer 22 in FIG. 3, or formation of oxide film 7 on p layer 32 in FIG. 4) produces an effect that the repetitive operation life of semiconductor device 1 is extended, or formation of the pn diode shown in FIG. 4 as semiconductor device 1 produces an effect that the long-term reliability of the forward voltage characteristics is improved (while the ON resistance tends to increase in accordance with use of the pn diode, the increase in the ON resistance is reduced). It is to be noted that the above-described edge dislocations have little effect on the characteristics of semiconductor device 1 as compared with the basal plane dislocations, and accordingly, do not cause remarkable deterioration of the characteristics of semiconductor device 1 even if they exist to some extent in the active layer.

The fact that the direction of the dislocation line substantially corresponds to [11-20] with respect to the basal plane dislocation means not only that the direction of the dislocation line corresponds to [11-20], but also that, for example, the angle formed between the direction of the dislocation line and the orientation represented by [11-20] is not more than 30°, more preferably, not more than 20°. Furthermore, the fact that the direction of the dislocation line substantially corresponds to [0001] with respect to the edge dislocation means not only that the direction of the dislocation line corresponds to [0001], but also that, for example, the angle formed between the direction of the dislocation line and the orientation represented by [0001] is not more than 30°, more preferably, not more than 20°. It is to be noted that a dislocation such as a basal plane dislocation and an edge dislocation can be distinguished by considering the factors such as the direction of the Burgers vector, the direction of the dislocation line, the shape of the concave portion (etch pit) obtained after etching such as KOH, and the like.

In the above-described semiconductor device 1, the off orientation of substrate 2 may be not more than ±5° in the <11-20> direction. Substrate 2 made of silicon carbide may be an SiC substrate of 4H polytype. Also in the above-described semiconductor device 1, the off orientation of substrate 2 may be not more than ±5° in the <01-10> direction. In this case, each of the above-described off orientations is a typical off orientation in the SiC substrate of 4H polytype, and allows the epitaxial layer to be readily formed on the SiC substrate. The off orientations are set to be not more than ±5°, in consideration of processing variations at the time of slicing the substrate.

In the above-described semiconductor device 1, the plane orientation of the main surface of substrate 2 may have an off angle of not less than −3° and not more than +5° with respect to a plane orientation {03-38}. More preferably, the plane orientation of the main surface of the substrate substantially corresponds to {03-38}, and further preferably, the plane orientation of the main surface of the substrate corresponds to {03-38}. The fact that the main surface of the substrate substantially corresponds to {03-38} means that the plane orientation of the main surface of the substrate falls within the range of the off angle that allows the plane orientation to be regarded as substantially {03-38} according to the processing accuracy of the substrate and the like. In this case, the off angle is assumed to fall within, for example, the range of ±2° with respect to {03-38}. Thus, in the case where the MOSFET is formed as a silicon carbide semiconductor device, the carrier mobility (channel mobility) of the channel region formed in the active layer (a region between $n^+$ regions 5 and 6 in p-type layer 4 in FIG. 1, or a portion of p region 23 contacting oxide film 26 and located between $n^+$ region 24 and voltage maintained layer 22 in FIG. 3) can be increased. Therefore, semiconductor device 1 having excellent characteristics can be obtained by using the active layer with reduced micropipes.

As described above, the off angle in an arbitrary direction with respect to the plane orientation {03-38} is set in the range of not less than −3° and not more than +5°. This is because it is considered that at least the above-described range is appropriate for the range of the off angle exhibiting the channel mobility of approximately not less than 90 cm$^2$/Vs which is assumed to provide an excellent carrier mobility (channel mobility).

In the above-described semiconductor device 1, substrate 2 may be higher in impurity concentration than buffer layer 21. Buffer layer 21 may be higher in impurity concentration than the active layer (voltage maintained layer 22 in FIG. 3). Since this causes an impurity concentration distribution favorable for forming the so-called vertical device, a vertical device just like semiconductor device 1 shown in FIG. 3 can readily be configured as a silicon carbide semiconductor device according to the present invention.

In the method of manufacturing a silicon carbide semiconductor device according to the present invention, the step of preparing substrate 2 made of silicon carbide and having an off angle of not less than 50° and not more than 65° with respect to a plane orientation {0001} is first carried out (substrate preparation step (S10)). Then, the step of forming buffer layer 21 made of silicon carbide on substrate 2 is carried out (buffer layer formation step (S20)). The step of forming an active layer on buffer layer 21 is carried out (epitaxial layer formation step (S30)). In the buffer layer formation step (S20), buffer layer 21 is formed on the film forming conditions that the micropipe density is lower in buffer layer 21 than in substrate 2, and the density of dislocations in which the direction of the Burgers vector corresponds to [0001] is higher in buffer layer 21 than in substrate 2. Specifically, in the step of forming the buffer layer, buffer layer 21 is formed on the film forming condition that the micropipes divide into screw dislocations (dislocation in which Burgers vector b=[0001] and the extending direction of the dislocation corresponds to approximately [0001]). Furthermore, the film forming conditions may include those in which a part of the screw dislocation is modified to a partial dislocation (dislocation in which Burgers vector b=[0001] and the extending direction of the dislocation corresponds to approximately [11-20]).

In this way, as the micropipe density in buffer layer 21 is decreased below the micropipe density in substrate 2, the micropipe density in the active layer (for example, p-type layer 4 or voltage maintained layer 22) formed on buffer layer 21 can consequently be decreased below the micropipe density in substrate 2. Furthermore, as the micropipe density in buffer layer 21 is decreased, the density of the defects in the active layer occurring (due to the micropipe defects in buffer layer 21) during growth of the active layer can be decreased. As a result, semiconductor device 1 having an active layer with reduced micropipe defects can readily be provided.

According to the method of manufacturing the silicon carbide semiconductor device as described above, in the step of forming buffer layer 21, buffer layer 21 may be formed on the film forming conditions that the density of basal plane dislocations in which the direction of the Burgers vector corresponds to [11-20] and the direction of the dislocation line substantially corresponds to [11-20] is lower in the active layer (epitaxial layer 3, p-type layer 4 and $n^+$ regions 5 and 6 in FIG. 1, or $n^+$ region 24, $p^+$ region 25, p region 23 and voltage maintained layer 22 in FIG. 3, or $n^-$ layer 31, p layer 32 and $p^+$ region 33 in FIG. 4) than in substrate 2; and the density of edge dislocations in which the direction of the Burgers vector corresponds to [11-20] and the direction of the dislocation line substantially corresponds to [0001] is higher in the above-mentioned active layer than in substrate 2. In this case, the density of basal plane dislocations in the active layer formed on buffer layer 21 can be decreased below the density of basal plane dislocations in substrate 2, which allows production of semiconductor device 1 in which the leakage current in the reverse direction is reduced and the long-term reliability of the electrical characteristics is improved.

In the method of manufacturing the silicon carbide semiconductor device as described above, on the film forming conditions in the buffer layer formation step (S20), the composition and the flow rate of the material gas may be determined such that the value of the C/Si ratio representing the ratio of carbon atoms to silicon atoms in the material gas used for forming buffer layer 21 is smaller than the value of the C/Si ratio in the epitaxial layer formation step (S30) for forming an active layer.

In this case, when buffer layer 21 is formed, the reaction can be promoted in which the micropipes divide into screw dislocations. Accordingly, the micropipe density in buffer layer 21 can be reliably decreased below the micropipe density in substrate 2. The micropipe density in buffer layer 21 is decreased below the micropipe density in substrate 2 as described above, with the result that the density of basal plane dislocations in the active layer formed on the buffer layer can be decreased below the density of basal plane dislocations in the substrate. Furthermore, in accordance with this decrease in the density of the basal plane dislocations, the density of edge dislocations in the active layer is increased above the density of edge dislocations in the substrate.

Any semiconductor device other than a pn diode and having an active layer formed on substrate 2 with buffer layer 21 interposed therebetween can be applied as the above-described semiconductor device according to the present invention. For example, the present invention can be applied to a bipolar transistor, a thyristor, and an IGBT (Insulated Gate Bipolar Transistor).

Example 1

The following experiments were conducted in order to confirm the effects of the present invention.

Sample

Sample of Example

As a sample of Example, a silicon carbide substrate (SiC substrate) of 4H polytype having a plane orientation of the main surface corresponding to (03-38) was prepared. The SiC substrate had a size of 2 inches and a micropipe density of 100 $cm^{-2}$. The density of dislocations in which the direction of the Burgers vector in the substrate corresponds to [0001] was $1.5 \times 10^3$ $cm^{-2}$.

A buffer layer made of SiC was formed on the substrate by the epitaxial growth method. The buffer layer had a thickness of 1 μm. In this case, the film forming conditions were set such that the flow rate of $SiH_4$ was 7.5 sccm, the flow rate of $C_3H_8$ was 3 sccm, the substrate temperature was 1550° C., and the growth time was 10 minutes. Thus, the value of the C/Si ratio in the step of forming the buffer layer was 1.2.

Then, an SiC layer as an active layer was formed on the buffer layer by the epitaxial growth method. The active layer had a thickness of 10 μm. In this case, the film forming conditions were set such that the flow rate of $SiH_4$ was 7.5 sccm, the flow rate of $C_3H_8$ was 5 sccm, the substrate temperature was 1550° C., and the growth time was 90 minutes. Thus, the value of the C/Si ratio in the step of forming the active layer was 2.

Sample of Comparative Example 1

The same SiC substrate as that of the sample of Example was first prepared. A buffer layer made of SiC was formed on this SiC substrate. This buffer layer had the same thickness as that of the buffer layer in the sample of Example. The film forming conditions of this buffer layer were, however, different from those in Example 1. Specifically, the film forming conditions were set such that the flow rate of $SiH_4$ was 7.5 sccm, the flow rate of $C_3H_8$ was 5 sccm, the substrate temperature was 1550° C., and the growth time was 10 minutes. Thus, the value of the C/Si ratio in the step of forming the buffer layer was 2.

Then, an SiC layer as an active layer was formed on the buffer layer, in which the film forming conditions were the same as those for the active layer in Example.

Sample of Comparative Example 2

The same SiC substrate as that of the sample of Example was first prepared. On the SiC substrate, an SiC layer as an active layer was directly formed without forming a buffer layer. The active layer had the same thickness as that of the active layer in Example. In this case, the film forming conditions were set such that the flow rate of $SiH_4$ was 7.5 sccm, the flow rate of $C_3H_8$ was 5 sccm, the substrate temperature was 1550° C., and the growth time was 90 minutes.

(Measuring Method)

The micropipe density of the substrate was measured using the method of etch pit observation by KOH etching.

Furthermore, the density of dislocations in which the direction of the Burgers vector of the substrate corresponds to [0001] was measured using the method of etch pit observation by KOH etching.

As for each of the active layer and the buffer layer, the micropipe density and the density of the above dislocations were measured also using the same method.

In Example and Comparative Example 2, the surface state of the active layer was observed using a microscope.

(Results)

In the active layer in Example, the micropipe density was 0 $cm^{-2}$, and the density of dislocations in which the direction of the Burgers vector corresponds to [0001] was $1.8 \times 10^3$ $cm^{-2}$.

Also in the buffer layer in Example, the micropipe density was 0 $cm^{-2}$, and the density of dislocations in which the direction of the Burgers vector corresponds to was $1.8 \times 10^3$ $cm^{-2}$.

In the active layer in Comparative Example 1, the micropipe density was 100 $cm^{-2}$, and the density of dislocations in which the direction of the Burgers vector corresponds to [0001] was $1.5 \times 10^3$ $cm^{-2}$.

Also in the buffer layer in Comparative Example 1, the micropipe density was 100 $cm^{-2}$, and the density of dislocations in which the direction of the Burgers vector corresponds to [0001] was $1.5 \times 10^3$ $cm^{-2}$.

Furthermore, in the active layer in Comparative Example 2, the micropipe density was 100 $cm^{-2}$, and the density of dislocations in which the direction of the Burgers vector corresponds to [0001] was $1.5 \times 10^3$ $cm^{-2}$.

Thus, with regard to the sample in Example, the micropipe density was lower in the active layer than in the substrate, and the density of dislocations in which the direction of the Burgers vector corresponds to [0001] was higher in the active layer than in the substrate.

Figure 5:
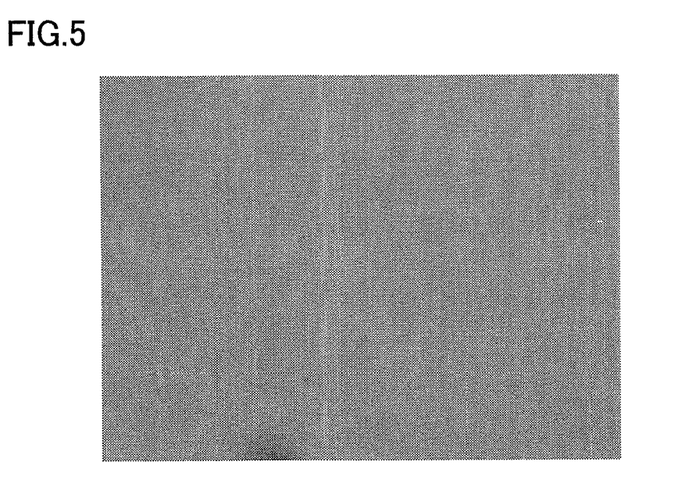
FIG. 5 is a photomicrograph showing the surface state of a sample in Example.
Figure 6:
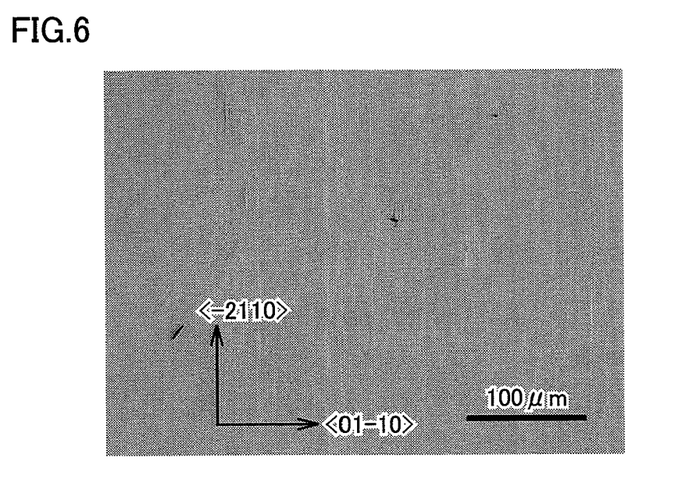
FIG. 6 is a photomicrograph showing the surface state of a sample in Comparative Example 2.
Figure 7:
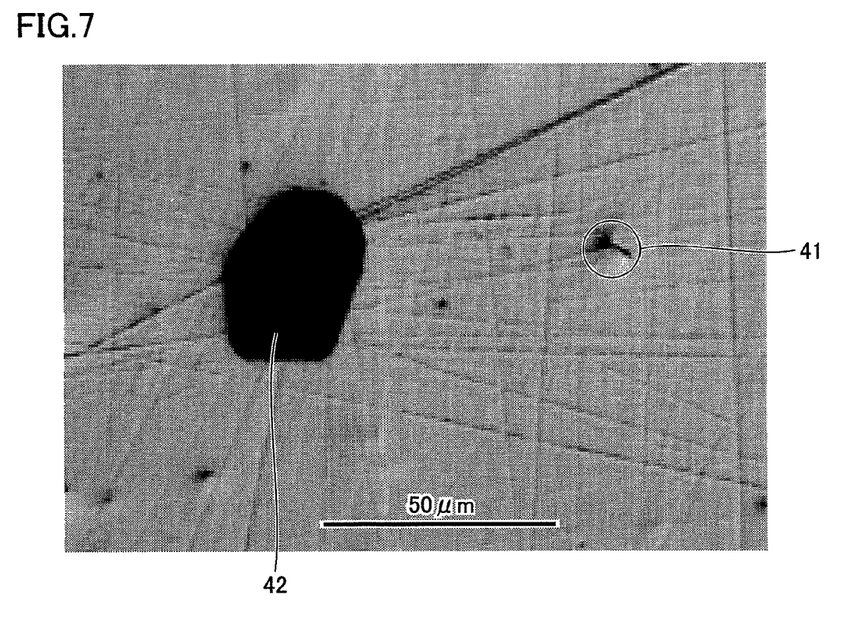
FIG. 7 is a photomicrograph showing the state after the surface of an active layer is subjected to KOH etching in Comparative Example.
Figure 8:
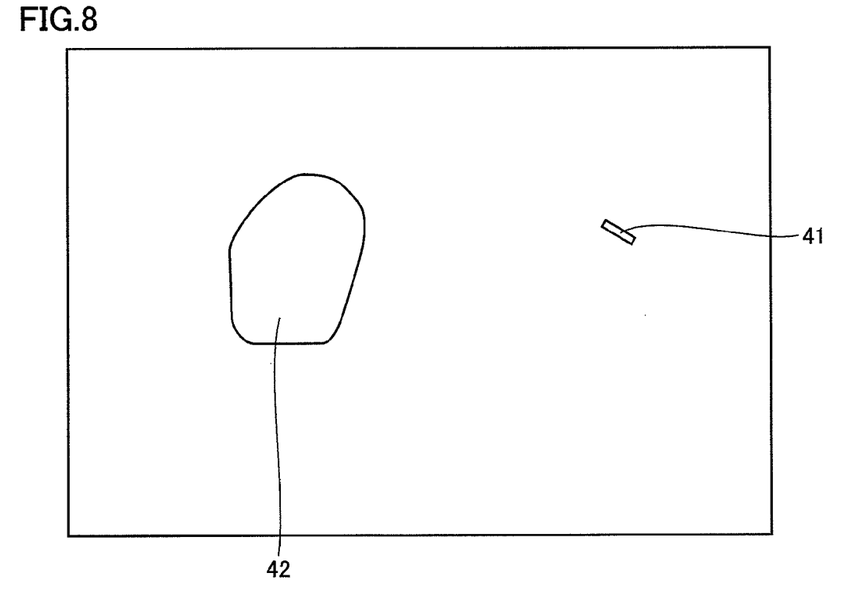
FIG. 8 is a schematic diagram for illustrating the photomicrograph shown in FIG. 7.
Figure 9:
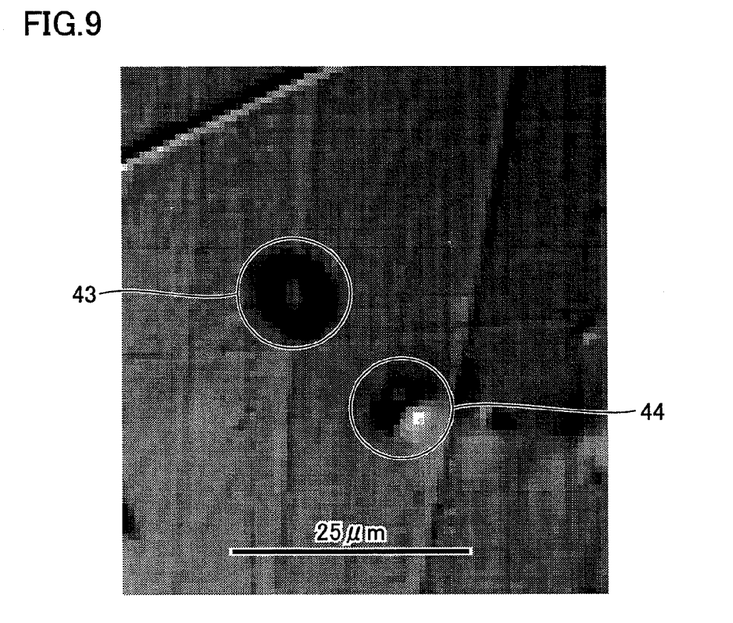
FIG. 9 is another photomicrograph showing the state after the surface of the active layer is subjected to KOH etching in Comparative Example.
Figure 10:
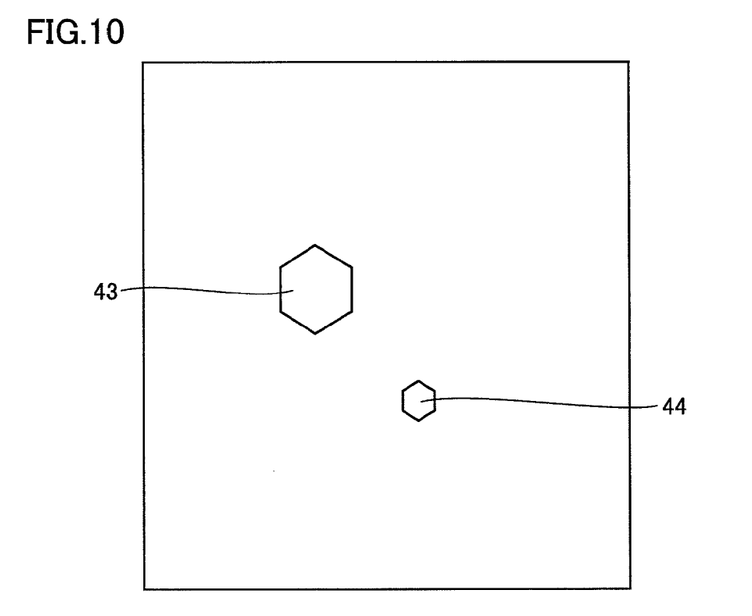
FIG. 10 is a schematic diagram for illustrating the photomicrograph shown in FIG. 9.

The results obtained by observing the surface of the active layer are shown in FIGS. 5 and 6.

In the sample of Example, the surface of the active layer was flat in shape as shown in FIG. 4. On the other hand, in the sample of Comparative Example 2, an opening and the like resulting from defects were observed on the surface of the active layer, as shown in FIG. 5. In the sample of Comparative Example 1, while the surface of the active layer was relatively flat as compared with that in the sample of Comparative Example 2, some defects were observed on the surface of the active layer as compared with the sample of Example.

Thus, in the sample of Example, the micropipe density of the active layer was decreased to allow the flatness of the surface of the active layer to be improved.

Example 2

The following experiments were conducted in order to confirm the effects of the present invention.

Sample

The samples of Example and Comparative Example were prepared using the same manufacturing method as that for the samples of Example and Comparative Example 2 in Example 1 described above.

(Measuring Method)

The micropipe density of the substrate was measured using the method of etch pit observation by KOH etching. The method of etch pit observation by KOH etching was also used for measuring the density of basal plane dislocations in the substrate in which the direction of the Burgers vector corresponds to [11-20] and the direction of the dislocation line substantially corresponds to [11-20], and for measuring the density of edge dislocations in the substrate in which the direction of the Burgers vector corresponds to [11-20] and the direction of the dislocation line substantially corresponds to [0001].

As for each of the active layer and the buffer layer, the micropipe density, the basal plane dislocation density and the edge dislocation density were measured also using the same method.

In Comparative Example, the surface state of the active layer was observed using a microscope.

(Results)

In the substrate in Example, the micropipe density was 100 $cm^{-2}$, the density of basal plane dislocations was $2.5\times10^3$ $cm^{-2}$, and the density of edge dislocations was $1.1\times10^4$ $cm^{-2}$. Also in the buffer layer in Example, the micropipe density was 0 $cm^{-2}$, the density of basal plane dislocations was $1.5\times10^2$ $cm^{-2}$, and the density of edge dislocations was $1.3\times10^4$ $cm^{-2}$. In the active layer in Example, the micropipe density was 0 $cm^{-2}$, the density of basal plane dislocations was $1.5\times10^2$ $cm^{-2}$, and the density of edge dislocations was $1.3\times10^4$ $cm^{-2}$.

In the substrate in Comparative Example, the micropipe density was 100 $cm^{-2}$, the density of basal plane dislocations was $2.5\times10^3$ $cm^{-2}$, and the density of edge dislocations was $1.1\times10^4$ $cm^{-2}$. Also in the buffer layer in Comparative Example, the micropipe density was 100 $cm^{-2}$, the density of basal plane dislocations was $2.5\times10^3$ $cm^{-2}$, and the density of edge dislocations was $1.1\times10^4$ $cm^{-2}$. In the active layer in Comparative Example, the micropipe density was 100 $cm^{-2}$, the density of basal plane dislocations was $2.5\times10^3$ $cm^{-2}$, and the density of edge dislocations was $1.1\times10^4$ $cm^{-2}$.

Thus, in the sample of Example, the micropipe density is lower in the active layer than in the substrate, and the density of basal plane dislocations is lower in the active layer than in the substrate. In contrast, in Example, the density of edge dislocations is higher in the active layer than in the substrate.

FIGS. 7-10 show the results of observing the state of the surface of the active layer obtained after KOH etching in the sample of Comparative Example.

Referring to FIGS. 7-10, on the surface of the active layer in Comparative Example, a concave portion 42 showing a micropipe, a concave portion 41 showing a basal plane dislocation, a concave portion 43 showing a screw dislocation, and a concave portion 44 showing an edge dislocation are observed which are caused by performing KOH etching. Concave portion 42 showing a micropipe is the largest in size, and has a polygonal shape (precisely, a hexagonal shape) in plan view (depending on the surface state of the active layer), in which its maximum diameter is not less than 40 μm and not more than 70 μm. Concave portion 43 showing a screw dislocation is the second largest and basically has a hexagonal shape in plan view. The maximum diameter of concave portion 43 showing a screw dislocation is not less than 10 μm and less than 40 μm. Concave portion 44 showing an edge dislocation basically has a hexagonal shape in plan view as with concave portion 43 showing a screw dislocation as described above, but is smaller in size than concave portion 43 showing a screw dislocation. Specifically, the maximum diameter of concave portion 44 showing an edge dislocation is not less than 5 μm and less than 10 μm. Furthermore, concave portion 41 showing a basal plane dislocation has a linear shape extending in the direction of the dislocation line ([11-20] direction) of the basal plane dislocation. In this way, a basal plane dislocation, a micropipe and the like described above can readily be distinguished based on the shape and the size of concave portions 41-44 after being subjected to KOH etching.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The present invention is advantageously applied to a silicon carbide semiconductor device such as an MOSFET and a DiMOSFET in which a semiconductor layer made of silicon carbide is used as an active layer.

The invention claimed is:

1. A silicon carbide semiconductor device comprising:
a substrate made of silicon carbide and having an off angle of not less than 50° and not more than 65° with respect to a plane orientation {0001};
a buffer layer made of silicon carbide and formed on said substrate; and
an active layer made of silicon carbide and formed on said buffer layer, and
a micropipe density being lower in said active layer than in said substrate, and
a density of dislocations in which a direction of a Burgers vector corresponds to [0001] being higher in said active layer than in said substrate;
wherein a density of basal plane dislocations in which a direction of a Burgers vector corresponds to [11-20] and a direction of a dislocation line substantially corresponds to [11-20] is lower in said active layer than in said substrate, and a density of edge dislocations in which a direction of a Burgers vector corresponds to [11-20] and a direction of a dislocation line substantially corresponds to [0001] is higher in said active layer than in said substrate.

2. The silicon carbide semiconductor device according to claim 1, wherein the micropipe density in said active layer is not more than 1 $cm^{-2}$.

3. The silicon carbide semiconductor device according to claim 1, wherein an off orientation of said substrate falls within a range of ±5° in a <11-20> direction.

4. The silicon carbide semiconductor device according to claim 1, wherein an off orientation of said substrate falls within a range of ±5° in a <01-10> direction.

5. The silicon carbide semiconductor device according to claim 4, wherein a plane orientation of a main surface of said substrate has an off angle of not less than −3° and not more than +5° with respect to a plane orientation {03-38}.

6. The silicon carbide semiconductor device according to claim 1, wherein
said substrate is higher in impurity concentration than said buffer layer, and
said buffer layer is higher in impurity concentration than said active layer.

7. A method of manufacturing a silicon carbide semiconductor device, comprising:
a step of preparing a substrate made of silicon carbide and having an off angle of not less than 50° and not more than 65° with respect to a plane orientation {0001};
a step of forming a buffer layer made of silicon carbide on said substrate; and
a step of forming an active layer on said buffer layer, and in said step of forming said buffer layer, said buffer layer being formed on film forming conditions that a micropipe density is lower in said buffer layer than in said substrate, and a density of dislocations in which a direction of a Burgers vector corresponds to [0001] is higher in said buffer layer than in said substrate;

wherein, in said step of forming said buffer layer, said buffer layer is formed on film forming conditions that a density of basal plane dislocations in which a direction of a Burgers vector corresponds to [11-20] and a direction of a dislocation line substantially corresponds to [11-20] is lower in said active layer than in said substrate, and a density of edge dislocations in which a direction of a Burgers vector corresponds to [11-20] and a direction of a dislocation line substantially corresponds to [0001] is higher in said active layer than in said substrate.

8. The method of manufacturing a silicon carbide semiconductor device according to claim 7, wherein, on said film forming conditions in said step of forming said buffer layer, a composition and a flow rate of a material gas is determined such that a value of a C/Si ratio representing a ratio of carbon atoms to silicon atoms in the material gas used for forming said buffer layer is smaller than the value of said C/Si ratio in said step of forming said active layer.

* * * * *